TRANSISTOR OSCILLATOR CIRCUIT

Filed March 17, 1954 2 Sheets-Sheet 1

INVENTOR.
FREDERICK D. WALDHAUER
BY H. L. Newton
ATTORNEY

June 12, 1956 F. D. WALDHAUER 2,750,508

TRANSISTOR OSCILLATOR CIRCUIT

Filed March 17, 1954 2 Sheets-Sheet 2

INVENTOR.
FREDERICK D. WALDHAUER

BY H. W. Weston

ATTORNEY

United States Patent Office 2,750,508

Patented June 12, 1956

2,750,508

TRANSISTOR OSCILLATOR CIRCUIT

Frederick D. Waldhauer, Haddonfield, N. J., assignor to Radio Corporation of America, a corporation of Delaware Application March 17, 1954, Serial No. 416,845

10 Claims. (Cl. 250—36)

This invention relates in general to electrical signal generators or oscillator circuits and in particular to such circuits utilizing semi-conductor devices of the junction type.

The recent development of commercially useful semi-conductor devices of the type employing a semi-conductive element having three contacting electrodes has already had a decided effect upon, and has caused the introduction of many new techniques in the electric signal communication field. These devices, known extensively as "transistors," are small in size, especially when compared with the ordinary vacuum tube, require no heater power, are very durable and consist of materials which appear to have a long useful life. Therefore, the use of transistors for oscillator as well as other circuit applications has been the subject of extensive investigation.

Transistors, as is well known, are of two general classes which are known as the point-contact transistor and the junction transistor. Each of these classes is known to exhibit different characteristics which have made one class preferable to the other for certain circuit applications.

The current gain of junction transistors, as defined by the ratio of collector electrode current increments to emitter electrode current increments, is less than unity. It has, moreover, been generally necessary to provide an external feedback path to sustain oscillations in those circuits utilizing junction transistors. Point-contact transistors, however, as is well known in the art, may be current multiplication devices and may, under certain conditions, exhibit a negative resistance. Thus, oscillators have been designed using point-contact transistors which do not require an external feedback path.

Recent developments have indicated that junction transistors are generally to be preferred in signal conveying and translating systems of all types. Because of the simplicity of known point-contact transistor oscillator circuits, however, these systems may utilize oscillator circuits of this type. It is obvious, of course, that the exclusive use of one type of transistor in a signal translating system, whether it be of the point-contact or junction type, is a decided advantage. Obviously, the exclusive use of one type transistor simplifies repair procedures when transistors need replacing. In addition, it permits the various transistor units to be normally interchangeable.

Both point-contact and junction transistor oscillator circuits have been characterized to some extent by frequency instability. It has been found, for example, that the fundamental operating frequency of a transistor oscillator may vary with time for a single setting of the circuit components. For most circuit applications frequency instability of the oscillator is, of course, undesirable.

It is, accordingly, an object of the present invention to provide an improved and simplified oscillator circuit which utilizes a transistor having a current gain less than unity.

It is a further object of the present invention to provide an improved low cost electrical signal generator circuit utilizing a junction transistor as the signal amplifying element.

It is still another object of the present invention to provide a semi-conductor oscillator circuit utilizing a transistor of the junction type which is characterized by stable and highly efficient circuit operation.

These and further objects and advantages of the present invention are achieved, in general, in an oscillator circuit which utilizes a junction transistor in a grounded emitter circuit configuration. A reactive impedance element is connected with the emitter electrode. Two further reactive impedance elements having opposite reactance characteristics to the first form a T-network with the first and are connected with the base and collector. By proper choice of the circuit parameters and appropriate biasing of the transistor electrodes, the feedback energy will be of proper phase and magnitude to overcome circuit losses and sustain oscillation. Such a circuit is characterized not only by its simplicity but by efficient, reliable and stable operation.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figures 1, 1A, 1B, 2, 3, 4:
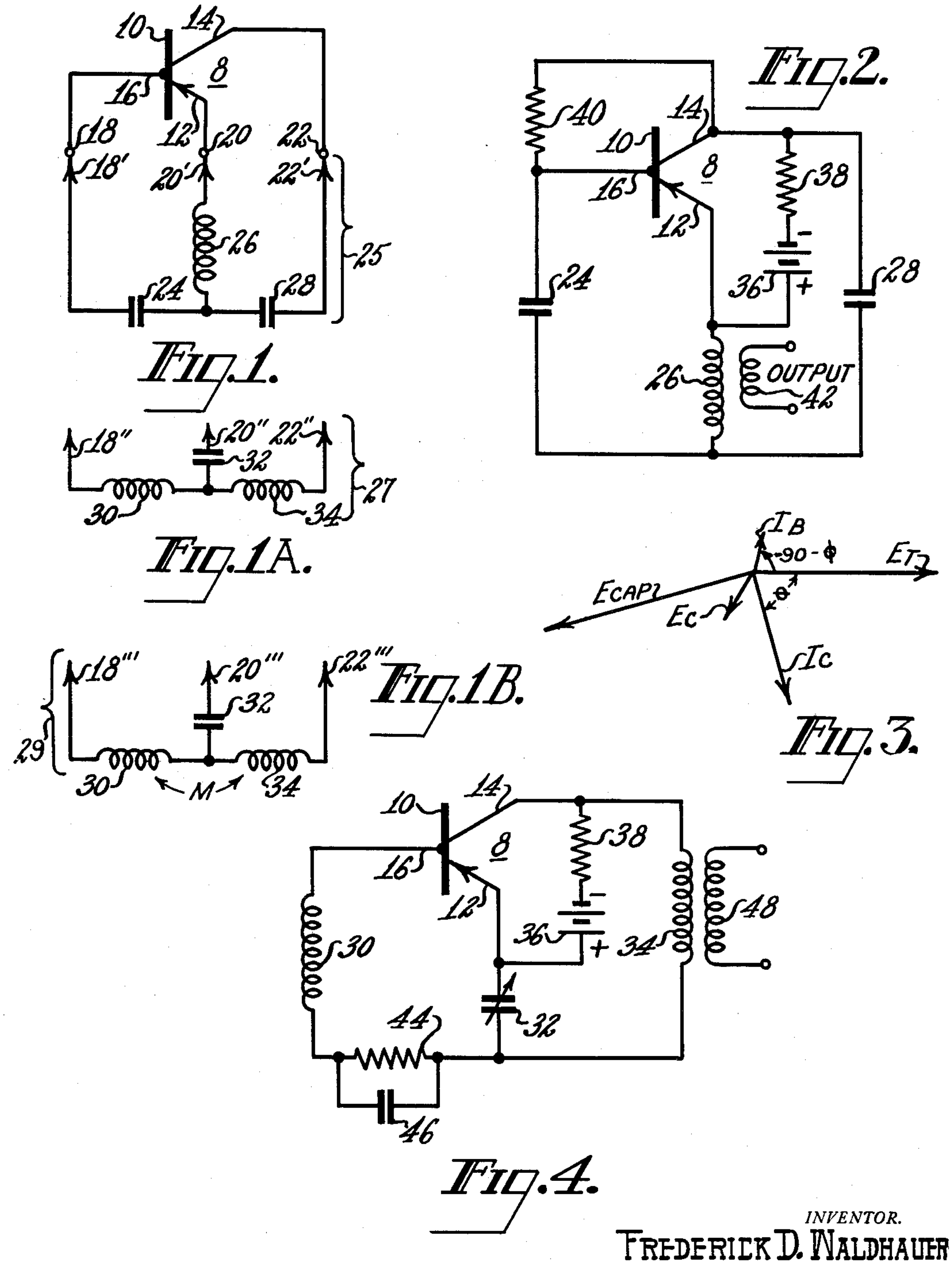
Figure 1 is a schematic circuit diagram of a transistor oscillator circuit embodying the invention and utilizing a P–N–P junction transistor.
Figures 1A and 1B are schematic circuit diagrams of alternative T-networks adapted for use in the circuit of Figure 1 in accordance with the invention.
Figures 2 and 4 are schematic circuit diagrams of complete oscillator circuits utilizing P–N–P junction transistors embodying the invention and connected in accordance with two of the T-network configurations illustrated in Figure 1.
Figure 3 is a vector diagram illustrating the relation of various currents and voltages of a circuit of the type illustrated in Figure 2.
Figure 5:
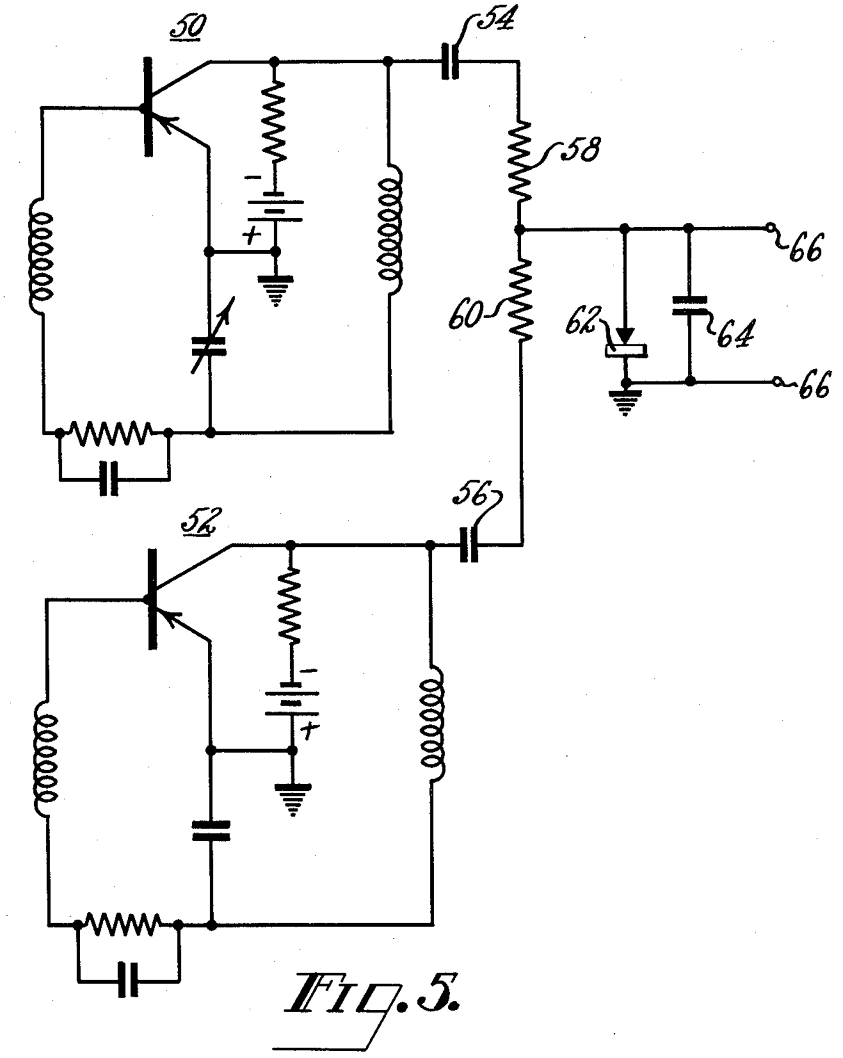
Figure 5 is a schematic circuit diagram of a beat frequency oscillator circuit utilizing a pair of oscillator circuits of the type illustrated in Figure 2.

Referring now to the drawing, wherein like components have been designated by the same reference numerals throughout the various figures, and referring particularly to Figures 1, 1A and 1B, a three terminal amplifier element comprises a transistor 8 having a semi-conductive body 10 of N-type conductivity and three contacting electrodes which are designated as an emitter 12, a collector 14 and a base 16. To each of these respective electrodes are connected terminals 20, 22 and 18, respectively. It should be understood that the schematic circuit diagram of Figure 1 is for the purpose of illustrating the dynamic or alternating current aspects of the present invention only. Thus the biasing, etc., has been eliminated for the sake of circuit simplicity.

An oscillator circuit, in accordance with the novel features of the present invention, may be constructed by connecting a three terminal network of the so-called T type with the respective electrode terminals of the transistor 10. To this end, in accordance with the invention, either of three T-networks which have been indicated generally by the reference numerals 25, 27 and 29 are adapted to be connected with the transistor 8. Thus the T-network 25 has terminals 18′, 20′ and 22′ which are connected with the corresponding electrode terminals 18, 20 and 22. Similarly, the T-networks 27 and 29 have terminals 18″, 20″ and 22″ and 18‴, 20‴ and 22‴ which are adapted to be connected with the electrode terminals 18, 20 and 22, respectively.

Each of the T-networks 25, 27 and 29 comprise in general, a common reactive impedance element for one arm, and two further reactive impedance elements for the other arms. The two further reactive impedance elements have opposite reactance characteristics to the common reactive impedance element.

Accordingly, one arm of the T-network 25 comprises a common inductor 26, while the other two arms comprise respective capacitors 24 and 28. The inductor 26 and the capacitor 24 are chosen to be resonant at some frequency above the operating frequency of the oscillator circuit, while the capacitor 28 is chosen to be approximately resonant with the inductive reactance afforded by the tank circuit comprising the capacitor 24 and the inductor 26 at the operating frequency.

Similarly, one arm of the T-network 27 comprises a common capacitor 32, while the other two arms comprise respective inductors 30 and 34. The inductor 30 and the capacitor 32 are chosen to be resonant at some frequency below the operating frequency of the oscillator circuit, while the inductor 34 is chosen to be approximately resonant with the reactive capacitance afforded by the tank circuit comprising the capacitor 32 and the inductor 30 at the operating frequency.

To permit greater design freedom, a T-network of the type illustrated by the reference numeral 29 may employ mutual inductive coupling between the inductors of the two inductive arms. This is illustrated by the T-network indicated generally by the numeral 29 wherein there is mutual inductive coupling between the inductors 30 and 34, as shown. In other respects this T-network is identical with the network 27.

An oscillator utilizing a T-network of the type indicated by the reference numeral 25 in Figure 1 is illustrated in Figure 2, reference to which is now made. Thus, the transistor 8 has the capacitor 28 connected with its output or collector electrode 14, the inductor 26 connected with its common or emitter electrode 12 and the capacitor 24 connected with its input or base electrode 16.

Proper biasing of the transistor 8 is accomplished by connecting the positive terminal of a biasing battery 36 to the junction of the emitter 12 and the inductor 26 and the negative terminal of the battery 36 through a resistor 38 to the collector 14. In addition, the base 16 is connected to the collector 14 through a resistor 40. Hence, the biasing will be recognized as being proper for the amplifying action of a transistor of N-type conductivity. That is, the collector 14 will be biased in the relatively non-conducting or reverse direction with respect to the base 16 while the emitter 12 will be biased in the relatively conducting or forward direction with respect to the base 16.

The output circuit for the transistor 8 includes an inductor 42 which is inductively coupled with the inductor 26 as shown.

In general, an oscillator circuit utilizing a junction transistor of the grounded emitter configuration must have a coupling network which provides substantially 180 degrees phase reversal between the collector and base, circuit losses which are low enough to insure sufficient feedback of signal energy, and some frequency selective means. The T-networks 25 and 27 adequately satisfy these requirements with a minimum number of circuit elements.

In explaining the operation of the circuit illustrated in Figure 2, it is assumed that the signal frequency is below the resonant frequency of the tank circuit, and that there are some circuit losses. A signal voltage which appears between the collector 14 and the emitter 12 causes a current to flow through the capacitor 28 into the tank circuit comprising the inductor 26 and the capacitor 24. The base-emitter impedance of the transistor 8 is in series with the capacitor 24 of the tank circuit. So long as the base-emitter impedance of the transistor is low, the current through the capacitor 24 or the base current will lead the tank voltage or the voltage across the inductor 26 by almost 90 degrees. Hence, the base current ($I_b$) is shown as leading the tank voltage ($E_T$) in the vector diagram illustrated in Figure 3 by 90 degrees minus the angle $\phi$. The angle $\phi$ represents the phase angle of the series combination of the capacitor 24 and the impedance of the base input lead.

Since the frequency of the signal is below resonant frequency, the impedance of the tank circuit is inductive. Therefore, the voltage across the tank circuit ($E_T$) leads the current through it, which is also the current ($I_c$) flowing in the collector circuit. Accordingly, in Figure 3, the tank voltage ($E_T$) is shown as leading the collector current ($I_c$) by an angle $\theta$, where $\theta$ equals the phase angle of the tank circuit impedance at the signal frequency. The vector ($E_{cap}$) represents the voltage across the capacitor 28 which leads the current ($I_c$) through this capacitor by ninety degrees.

The collector current ($I_c$) is caused to lead the collector voltage by the capacitor 28, and if the capacitance of this capacitor is small, this current can lead the voltage between the collector and emitter. Consequently, all three of the reactive elements cause an advance in phase and there is a possibility of the total phase shift in the coupling network approaching 270 degrees and a phase shift of 180 degrees is easily possible. Since this is a phase advance, this type circuit may find its widest application at lower frequencies, where little retardment of phase is contributed by the transistor 8. Hence, the energy fed back from the collector 14 to the base 16 of the transistor 8 will be of proper phase and magnitude to overcome normal circuit losses and sustain oscillation. An oscillator circuit in accordance with the invention is seen, moreover, to be characterized by circuit simplicity. In addition, circuit operation is stable and extremely reliable.

A circuit of the type illustrated in Figure 2 has been built and tested for operation at 550 cycles per second. While it will be understood that the circuit specifications may vary according to the design for any particular application, the following circuit specifications are included by way of example only:

| | |
|---|---|
| Battery 36 | 22.5 volts. |
| Resistors 38, 40 | 22,000 and 100,000 ohms, respectively. |
| Capacitors 24, 28 | .047 and .015 microfarad, respectively. |
| Inductor 26 | 1.3 henries. |

Referring now to Figure 4, an oscillator utilizing a T-network of the type indicated by the reference numeral 27 in Figure 1 includes a transistor 8 having the capacitor 32 connected with its emitter 12 and respective inductors 34 and 30 connected with its collector 14 and base 16.

Proper biasing of the transistor 8 is accomplished by connecting the positive terminal of the biasing battery 36 to the junction of the emitter 12 and the capacitor 32 and the negative terminal of the battery 36 through a resistor 38 to the collector 14. In addition, to provide self-bias for the transistor 8, a resistor 44 is connected in series between the capacitor 32 which is variable as shown and the inductor 30 and is by-passed by a capacitor 46. Hence, the biasing will be recognized as being proper for the amplifying action of a transistor of N-type conductivity. That is, the collector 14 will be biased in the relatively non-conducting or reverse direction with respect to the base 16 while the emitter 12 will be biased in the relatively conducting or forward direction with respect to the base 16.

The output circuit for the transistor 8 includes an inductor 48 which is inductively coupled with the inductor 34 as shown.

An analysis of the circuit illustrated in Figure 4 similar to the one performed above for Figure 2 will indicate that the feedback of signal energy is of proper phase and magnitude to sustain oscillation. By utilizing the type of T-network shown in Figure 3, however, the phase angle of the energy which is fed back will be retarded. Hence, this oscillator circuit is adapted for operation at higher frequencies where phase shift in the transistor aids the overall phase retardment. The frequency of these oscillations may be varied by varying the capacitance of the capacitor 32. Such a circuit is also characterized by its relative simplicity, its reliability, and the stability of operation afforded.

Oscillator circuits as described herein may be useful for many purposes, for example, as the local oscillator of a superheterodyne receiver. Moreover, such oscillator circuits may be used as test oscillation generators as by using two oscillator circuits in combination as a beat frequency oscillator (B. F. O.). Such an application is illustrated in Figure 4, reference to which is now made.

In Figure 4, two oscillator circuits of the type illustrated in Figure 3 are indicated generally by the reference numerals 50 and 52. The oscillator circuits are identical with the one shown in Figure 3 except that the positive terminal of the biasing battery is grounded for convenience. Output signals from the respective oscillator circuits are capacitively coupled to a diode mixer. To this end, respective capacitors 54 and 56 are connected directly with the transistor oscillators of the oscillator circuits 50 and 52. The capacitor 54 and the capacitor 56 are connected through respective series resistors 58 and 60 to a common point. A diode mixer 62 has its positive electrode connected to the common point and its negative electrode grounded. A capacitor is connected in parallel with the diode mixer 62.

In actual practice, the oscillator circuit 52 may be used as a source of fixed frequency oscillations. The oscillator circuit 50, on the other hand, may be used as a source of variable frequency oscillations. To this end the capacitor connected with the emitter of the transistor of this oscillator circuit is variable as shown. The output signals obtained from the two oscillator circuits are combined and applied to the diode mixer 62 where they are heterodyned together. The output signal from the diode 62, which appears at the output terminals 66 represents a difference frequency. As described, it is seen that a small percentage variation in the frequency of the oscillator circuit 50 will vary the beat or difference frequency output continuously from a few cycles per second throughout the entire audio frequency spectrum. By utilizing two oscillator circuits embodying the present invention, the B. F. O. output signal can be made substantially constant as the frequency of operation is varied.

As described herein, oscillator circuits utilizing grounded emitter junction transistors are characterized by their relative simplicity. While using simple circuit connections, such circuits are also reliable and their operation is both highly stable and efficient.

What is claimed is:

1. An oscillation generator comprising a semi-conductor device having a semi-conductive body and base, emitter and collector electrodes cooperatively associated therewith, means including a source of operating bias voltage for applying biasing potentials to said electrodes, a first reactive impedance element connected with said emitter electrode, a second reactive impedance element connected with said base electrode, a third reactive impedance element connected with said collector electrode, said second and third impedance elements having opposite reactive characteristics to the reactive characteristic of said first impedance element, and means connecting said impedance elements to a common point to form in combination a T-network providing regenerative feedback from said collector to said base electrode.

2. An oscillation generator comprising a semi-conductor device having a semi-conductive body of the junction type and base, emitter and collector electrodes cooperatively associated therewith, means including a source of operating bias voltage for applying biasing potentials to said electrodes, an inductor connected with said emitter electrode, a first capacitor connected with said base electrode, and a second capacitor connected with said collector electrode, said first and second capacitors and said inductor comprising a frequency selective T-network and providing regenerative feedback for sustained oscillation of said generator.

3. An oscillation generator comprising a semi-conductor device having a semi-conductive body of the junction type and base, emitter and collector electrodes cooperatively associated therewith, means including a source of operating bias voltage for applying biasing potentials to said electrodes, a capacitor connected with said emitter electrode, a first inductor connected with said base electrode, and a second inductor connected with said collector electrode, said first and second inductors and said capacitor comprising a frequency selective T-network and providing regenerative feedback for sustained oscillation of said generator.

4. In an oscillator circuit, the combination with a semi-conductor device having a semi-conductive body and base, collector and emitter electrodes in contact therewith, of a frequency selective T-network cooperatively associated with said device and comprising a first reactive impedance element connected with said emitter electrode, and a second and a third reactive impedance element connected with said base and collector electrodes respectively, said second and third impedance elements each having reactive characteristics opposite to the reactive characteristics of said first element.

5. In an oscillator circuit, the combination comprising a semi-conductor device having a semi-conductive body of the junction type and a base, a collector and an emitter electrode in contact therewith, means for applying an operating bias voltage between said base and emitter electrodes and said collector and emitter electrodes, and means providing signal feedback from said collector to said base including a frequency selective T-network, said network including a common reactive element connected with said emitter, and two further reactive elements connected with said base and collector respectively and having opposite reactive characteristics to said common reactive element.

6. In an oscillator circuit, the combination with a semi-conductor device having a semi-conductive body and an input, an output and a common electrode in contact therewith, of signal feedback means providing regenerative feedback between said output and input electrodes, said feedback means comprising a T-network including a common reactive element connected with said common electrode, and two further reactive elements connected with said input and output electrodes respectively and having reactive characteristics opposite to the reactive characteristics of said first reactive element.

7. An oscillation generator comprising a semiconductor device and input, output and common electrodes cooperatively associated therewith, a first reactive impedance element connected with said common electrode, a second reactive impedance element connected with said input electrode, and a third reactive impedance element connected with said output electrode, said second and third impedance elements having opposite reactive characteristics to the reactive characteristic of said first impedance element and forming a frequency selective T-network in combination therewith.

8. In an oscillator circuit, the combination comprising a semi-conductor device having a semi-conductive body of the junction type and a base, a collector and an emitter electrode in contact therewith, means for applying an operating bias voltage between said base and emitter electrodes and said collector and emitter electrodes, and means providing regenerative signal feedback from said collector to said base including a frequency selective T-network, said network including a common reactive element connected with said emitter, and two further reactive elements connected with said base and collector respectively and having opposite reactive characteristics to said common reactive element, means connecting said reactive elements to a common point, and a signal output circuit coupled with one of said reactive elements.

9. An oscillator circuit comprising a semi-conductor device having a semi-conductive body and base, emitter and collector electrodes cooperatively associated therewith, means including a source of operating bias voltage for applying biasing potentials to said electrodes, means including a serially connected first capacitor and an inductor coupling said collector with said emitter electrode, means including said inductor and a second capacitor coupling said emitter with said base electrode, said inductor and said second capacitor providing in combination with said first capacitor a regenerative feedback path from said collector to said base to sustain oscillation of said circuit over a range of frequencies.

10. In an oscillator circuit, the combination comprising a semi-conductor device having a semi-conductive body and a base, a collector and an emitter electrode in contact therewith, means for applying an operating bias voltage to said electrodes, means including a serially connected first inductor and a capacitor coupling said collector with said emitter electrode, means including said capacitor and a second inductor coupling said emitter with said base electrode, said capacitor and said second inductor providing in combination with said first inductor a regenerative feedback path from said collector to said base to sustain oscillation of said circuit over a range of frequencies.

References Cited in the file of this patent

UNITED STATES PATENTS

| | | |
|---|---|---|
| 2,583,137 | Bussard | Jan. 22, 1952 |
| 2,680,160 | Yaeger | June 1, 1954 |
| 2,681,996 | Wallace | June 22, 1954 |